(12) United States Patent
Bosque et al.

(10) Patent No.: US 11,887,777 B2
(45) Date of Patent: Jan. 30, 2024

(54) SYSTEM AND METHOD TO MANAGE HIGH STRESSES IN BI-2212 WIRE WOUND COMPACT SUPERCONDUCTING MAGNETS

(71) Applicant: Florida State University Research Foundation, Inc., Tallahassee, FL (US)

(72) Inventors: Ernesto S. Bosque, Tallahassee, FL (US); Youngjae Kim, Tallahassee, FL (US); Ulf P. Trociewitz, Crawfordville, FL (US); Charles L. English, Saint Marks, FL (US); David C. Larbalestier, Tallahassee, FL (US)

(73) Assignee: FLORIDA STATE UNIVERSITY RESEARCH FOUNDATION, INC., Tallahassee, FL (US)

( * ) Notice: Subject to any disclaimer, the term of this patent is extended or adjusted under 35 U.S.C. 154(b) by 1190 days.

(21) Appl. No.: 16/390,512

(22) Filed: Apr. 22, 2019

(65) Prior Publication Data

US 2019/0392989 A1   Dec. 26, 2019

Related U.S. Application Data

(60) Provisional application No. 62/688,570, filed on Jun. 22, 2018, provisional application No. 62/735,589, filed on Sep. 24, 2018.

(51) Int. Cl.
| | | |
|---|---|---|
| *H01F 41/04* | (2006.01) | |
| *H01F 41/12* | (2006.01) | |
| *H01F 41/098* | (2016.01) | |
| *H01F 6/06* | (2006.01) | |

(Continued)

(52) U.S. Cl.
CPC ........... *H01F 41/048* (2013.01); *H01B 12/00* (2013.01); *H01F 6/06* (2013.01); *H01F 41/098* (2016.01); *H01F 41/127* (2013.01); *H10N 60/01* (2023.02)

(58) Field of Classification Search
CPC ........ H01F 41/048; H01F 41/098; H01F 6/06; H01F 41/127; H01B 12/00; H10N 60/01
See application file for complete search history.

(56) References Cited

U.S. PATENT DOCUMENTS

| | | | |
|---|---|---|---|
| 5,065,496 A | | 11/1991 | Jarabak et al. |
| 5,312,802 A | * | 5/1994 | Hayashi ............... H01F 6/06 |
| | | | 505/700 |
| 5,798,678 A | | 8/1998 | Manlief et al. |

(Continued)

OTHER PUBLICATIONS

International Search Report dated Aug. 16, 2019 in PCT/US19/28491.

(Continued)

*Primary Examiner* — Paul A Wartalowicz
(74) *Attorney, Agent, or Firm* — FOX ROTHSCHILD LLP

(57) ABSTRACT

A coil for a magnet includes a superconductor comprising a $Bi_2Sr_2CaCu_2O_{8+\delta}$ (Bi-2212) high temperature superconductor (HTS) filament. The HTS filament can be encased in a protective conducting sheath. The superconductor is wound to form a coil. A reinforcement winding is wound with the superconductor. The reinforcement winding can be a wire, a tape, a band, and an outer layer encasing the superconductor filament. A method of making a coil for a magnet, a composite superconductor for a magnet, and a magnet are also disclosed.

15 Claims, 9 Drawing Sheets

(51) Int. Cl.
  *H01B 12/00*   (2006.01)
  *H10N 60/01*   (2023.01)

(56) References Cited

U.S. PATENT DOCUMENTS

| | | |
|---|---|---|
| 2003/0059652 A1 | 3/2003 | Wang et al. |
| 2008/0015429 A1* | 1/2008 | Tsonton .............. A61B 90/11 |
| | | 600/414 |
| 2008/0022506 A1 | 1/2008 | Bittner |
| 2008/0210454 A1* | 9/2008 | Fee ..................... H02K 3/14 |
| | | 29/599 |
| 2011/0180357 A1* | 7/2011 | Schein ................ H02K 3/522 |
| | | 242/430 |
| 2014/0296077 A1 | 10/2014 | Shen |
| 2016/0141080 A1 | 5/2016 | Otto et al. |
| 2016/0260527 A1 | 9/2016 | Otto |
| 2018/0067075 A1* | 3/2018 | Racz .................... C25D 13/20 |

OTHER PUBLICATIONS

Europen Search Report dated Feb. 18, 2022 in EP 19823394.2.
Larbalestier et al.: "Isotropic round-wire multifilament cuprate superconductor for generation of magnetic fields above 30 T", Nature Materials, Mar. 9, 2014.

\* cited by examiner

SYSTEM AND METHOD TO MANAGE HIGH STRESSES IN BI-2212 WIRE WOUND COMPACT SUPERCONDUCTING MAGNETS

CROSS-REFERENCE TO RELATED APPLICATIONS

This application claims priority to U.S. Provisional Application No. 62/688,570 filed Jun. 22, 2018 and U.S. Provisional Application No. 62/735,589 filed Sep. 24, 2018, the entire disclosures of which are hereby incorporated by reference.

STATEMENT REGARDING FEDERALLY SPONSORED RESEARCH AND DEVELOPMENT

This invention was made with government support under Grant No. NSF/DMR-1644779 awarded by the National Science Foundation. The government has certain rights in this invention.

FIELD OF THE INVENTION

The present invention relates generally to magnets, and more particularly to magnets incorporating high temperature superconductors such as Bi-2212 ($Bi_2Sr_2CaCu_2O_{8+\delta}$).

BACKGROUND OF THE INVENTION

Bi-2212 ($Bi_2Sr_2CaCu_2O_{8+\delta}$) is a new high temperature superconductor (HTS) with very high current carrying capabilities that is commercially available and capable for use in high field magnets. It is particularly useful where high field homogeneity and long term field stability are required, as in nuclear magnetic resonance (NMR) magnets, which have developed into becoming essential tools in biological and medical science, for example as tools to understand and decipher protein structures to enable the development of improved medical treatments. Current high field all-superconducting magnets made with low temperature superconductors (LTS) cannot operate in fields or generate fields beyond 25 T. Since HTS conductors retain the superconducting state at fields far above 100 T and liquid helium temperature, they can be used as a solution to the problem.

Magnets are the principal market for superconductors, but making attractive conductors out of the high-temperature cuprate superconductors has proved difficult because of the presence of high-angle grain boundaries that are generally believed to lower the critical current density, $J_c$. To minimize such grain boundary obstacles, HTS conductors such as $REBa_2Cu_3O_{7x-}$ and $(Bi,Pb)_2Sr_2Ca_2Cu_3O_{10x-}$ are both made as tapes with a high aspect ratio and a large superconducting anisotropy. It has been reported that Bi-2212 can be made in the much more desirable isotropic, round-wire, multifilament form that can be wound or cabled into arbitrary geometries and will be especially valuable for high-field NMR magnets beyond the present 1 GHz proton resonance limit of $Nb_3Sn$ technology. See Larbalestier et al, "Isotropic round-wire multifilament cuprate superconductor for generation of magnetic fields above 30T," Nature Materials, 2014, pp. 1-7, the disclosure of which is hereby fully incorporated by reference. An appealing attribute of this Bi-2212 conductor is that it contains many high-angle grain boundaries but nevertheless attains a very high $J_c$ of 2,500 A $mm^{-2}$ at 20 T and 4.2 K.

One disadvantage of the Bi-2212 conductor is its relatively weak mechanical properties. A typical magnet is manufactured anywhere from tens to hundreds of meters of conductor wound onto a mandrel. The current driven through the windings of conductor generates a magnetic field. The vector product of the current density and the magnetic field, perpendicular to which the current flows, results in a net Lorentz force. In solenoids this force acts to expand the windings outward, placing individual wires in azimuthal (circumferential) tension thus exerting tensile strain on the conductor. High field electromagnets inherently depend on high current densities to produce high magnetic fields, which ultimately demands engineering solutions to manage large Lorentz stresses, thereby mitigating conductor strains. These Lorentz forces can strain the conductor and ultimately destroy it if no precautions are taken to resist them.

Typical ways of mechanically reinforcing superconducting magnets include co-winding with various high strength materials that are added to the superconducting wire during coil winding, and over-banding that is adding a high strength material on the outer surface of the as wound coil. Overbanding, one of the most common reinforcement techniques, is much less efficient because it is far from the internal coil wires where the stress is generated. Over-banding is less efficient in epoxy impregnated coils. Some coils are impregnated with wax, which do not mechanically couple the outer windings with the inner windings, and thus wax impregnated coils have the largest stresses on the outer windings. This is not the case with epoxy impregnated coils. In the case of Bi-2212 wire wound magnets, the wire has to be heat treated at temperatures of up to 890° C. after being wound into a magnet, and all reinforcements inside the magnet have to be able to withstand these temperatures without degrading, and also without degrading the Bi-2212 conductor.

SUMMARY OF THE INVENTION

A coil for a magnet includes a superconductor comprising a $Bi_2Sr_2Ca_1Cu_2O_{8+\delta}$ (Bi-2212) high temperature superconductor (HTS) filament. The superconductor can be wound to form a coil. A reinforcement winding can be wound with the superconductor.

The reinforcement winding can be made of a material that has a modulus of elasticity 100 GPa, a tensile strength above 0.5 GPa, is chemically inert with respect to the Bi-2212, and retains these properties after a heat treatment to 890° C. The reinforcement material can include at least one selected from the group consisting of $Al_2O_3$ and Inconel X750.

The reinforcement winding can take varying forms. The reinforcement winding can be at least one selected from the group consisting of a wire, a tape, a band, and an outer layer encasing the superconducting filament.

The superconductor filament can be encased in a protective conducting sheath. The protective conducting layer can be Ag. The superconductor can be circular or rectangular in cross section.

The superconductor can be wound in a coil as orthocyclic. The superconductor can be wound in a coil as hexagonal pack. The coil can have a tensile strain no greater than 0.6%. The coil can include a coil mandrel, the superconductor, and the reinforcement winding wound on the mandrel. The superconductor and reinforcement winding can be embedded in epoxy.

A method of making a coil for a magnet can include the step of providing a superconductor comprising a $Bi_2Sr_2Ca_1Cu_2O_{8+\delta}$ (Bi-2212) high temperature superconductor (HTS) filament. The superconductor is wound to form a coil. A reinforcement winding is wound with the superconductor.

The superconductor can be wound so as to form winding gaps. The reinforcement winding can be co-wound into the winding gaps. The superconductor can be wound as orthocyclic. The superconductor can be wound as hexagonal pack.

The method can further include the step of heat treating the conductor and the reinforcement winding to a temperature of at least 890° C. after the conductor and the reinforcement winding have been wound into a coil. The heat treatment can be conducted in an oxygen rich environment.

The method can include the step of winding the superconductor and the reinforcement winding on a mandrel. The method can also include the step of embedding the superconductor and the reinforcement winding in epoxy.

A composite superconductor for a magnet can include a high temperature superconductor comprising a superconductor filament, and a reinforcement material attached to the high temperature superconductor. The high temperature superconductor filament is $Bi_2Sr_2Ca_1Cu_2O_{8+\delta}$ (Bi-2212). The composite superconductor can include a protective conducting sheath surrounding the high temperature superconductor filament and interposed between the high temperature superconductor filament and the reinforcement material. The protective conducting sheath can be Ag.

A magnet according to the invention can include a coil, the coil including a superconductor comprising a high temperature superconductor (HTS) filament. The superconductor can be wound to form a coil. A reinforcement winding is wound with the superconductor.

BRIEF DESCRIPTION OF THE DRAWINGS

There are shown in the drawings embodiments that are presently preferred it being understood that the invention is not limited to the arrangements and instrumentalities shown, wherein.

DETAILED DESCRIPTION OF THE INVENTION

Figure 1A:
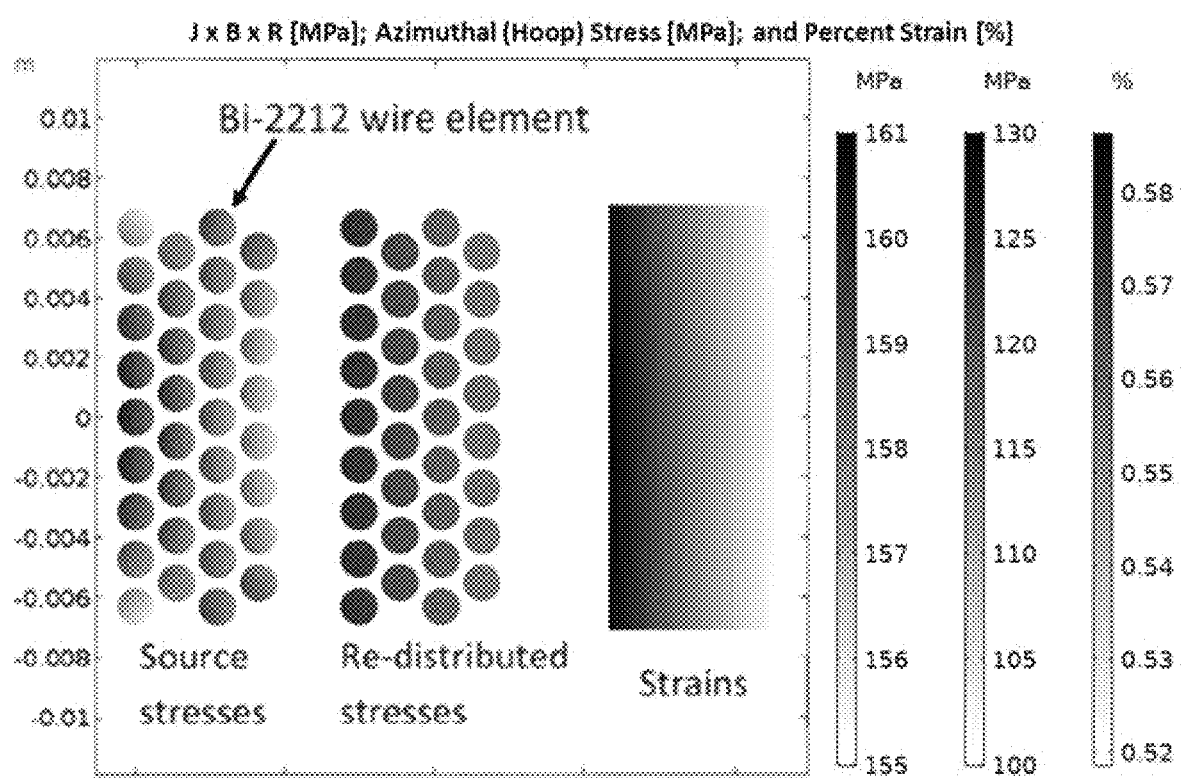
FIG. 1A is a stress and strain map of a 4 layer coil in an 8 T background magnetic field.

A coil for a magnet includes a superconductor comprising a $Bi_2Sr_2CaCu_2O_{8+\delta}$ (Bi-2212) high temperature superconductor (HTS) filament which can be encased in a protective conducting sheath. The superconductor is wound to form a coil. A reinforcement winding wire, band, tape and/or fabric can be co-wound with the conductor or positioned between layers of superconductor winding, or both. The term reinforcement winding as used herein means that the reinforcement material is wrapped completely at least one complete turn at one level of the superconductor coil somewhere between the innermost wrapping layer of the superconductor coil and the outermost wrap of the superconductor coil. The superconductor is usually formed by a superconductor filament within a protective conducting sheath. The reinforcement winding can include a co-winding with the superconductor, in which the reinforcement is a wire or tape that is wound adjacent or over the superconductor. The reinforcement winding can be provided at every wrap of the coil or only at some wraps. The reinforcement winding can also be a reinforcement band that is wrapped around the superconductor coil at one or more layers of superconductor wrapping between the innermost layer and the outermost layer. The reinforcing material can include combinations of co-winding and banding reinforcements.

The reinforcement winding is made from a material that should have a modulus of elasticity ≥100 GPa. The reinforcement should have a tensile strength above 0.5 GPa. The reinforcement material can have a modulus of elasticity ≥200 GPa. The reinforcement can have a tensile strength above 1 GPa. The reinforcement material should be chemically inert with respect to the Bi-2212. The reinforcement material should retain these properties after a heat treatment to 890° C. The reinforcement material must retain its tensile strength from 890° C. down to −269° C. The Bi-2212 releases oxygen during the heat treatment process, and the reinforcement material and magnet coil design must permit the ingress of this oxygen.

Materials which satisfy the above criteria include ceramics and metals. A suitable ceramic reinforcement material is $Al_2O_3$. A suitable metal reinforcement material is a nickel super alloy—Inconel X750. Other reinforcement materials are possible, such as SiC. The dimensions of the reinforcement material will depend on the material properties and the particular use. A thicker reinforcement will be needed to achieve higher stress management at the expense of winding pack current density. These factors must be balanced for the particular use.

The protective conducting sheath is known for Bi-2212 superconductors and can be any suitable material. In one embodiment, the protective conducting sheath that is commonly used is Ag. The superconductor filament is formed from a powder that is formed into a superconductor filament during the heat treatment. The dimensions and geometry of the superconductor filament will in part depend on the dimensions and geometry of the protective conducting sheath. The superconductor filament can thereby have different cross sectional geometries. In one embodiment, the Bi-2212 superconductor filament can be circular in cross section. In another embodiment, the Bi-2212 superconductor filament can be slightly aspected.

The coil can be wound according to different winding methods. In one embodiment, the winding is orthocyclic. Orthocyclic refers to horizontal windings at zero pitch; transitions from turn-to-turn of the continuous wire are made with jogs rather than the natural spiral achieved in a pitched, or helical winding. The winding can also be hexagonal pack. Hexagonal pack refers to subsequent layers of round or aspected wires resting in the top interstitials of the previous layers, increasing the fraction of current carrying conductor across the rectangular envelope of the whole coil.

The invention can limit the tensile strain to protect the conductor from damage. The reinforcing material act on the stress to mitigate strain. The tensile strain of the conductor in one embodiment is limited by the invention to a tensile strain no greater than 0.6%. The tensile strain can be limited to 0, 0.05, 0.1, 0.15, 0.2, 0.25, 0.3, 0.35, 0.4, 0.45, 0.5, 0.55, and 0.6, or can be within a range of any high value and low value selected from these values.

The coil can further include other structures used with superconducting coils. The superconductor coil can include a coil mandrel. Any suitable mandrel can be utilized. The conductor and co-winding can be wound on the mandrel by known methods or by methods and machinery specifically designed for this purpose.

A method of making a coil for a magnet includes the steps of providing a conductor comprising a $Bi_2Sr_2CaCu_2O_{8+\delta}$ (Bi-2212) high temperature superconductor (HTS) filament precursor powder which can be encased in a protective conducting sheath. The superconductor is wound to form a coil. The method includes the step of winding the superconductor with a reinforcement winding. The winding step can include winding the superconductor filament so as to form winding gaps. A reinforcement wire can be co-wound into the winding gaps. The superconductor can be circular in cross section or aspected. When aspected, the reinforcement co-winding can be provided in the form of a flat tape, which can lie on top of the previous aspected superconductor windings, instead of resting in the gaps formed by round superconductor.

The method can further comprise the step of heat treating the coil after the superconductor and reinforcement winding have been wound into a coil. The heat treatment can heat the conductor and reinforcement winding to a temperature of at least 883° C.-890° C. The heat treatment should be to a temperature that is near or at the melting point of Bi-2212 (890° C.) and below the melting point of the Ag matrix. The heat treatment can be conducted in an oxygen rich environment, usually 1 atm of $O_2$ in Ar. The method can further include the step of positioning one or more reinforcement winding layers in the superconducting coil.

A composite superconductor for a magnet can include a superconductor which includes a high temperature superconductor filament, and a reinforcement winding attached to the superconductor. The high temperature superconductor filament can be $Bi_2Sr_2CaCu_2O_{8+\delta}$ (Bi-2212). The reinforcement winding can be $Al_2O_3$ or Inconel X750. The composite superconductor can further include a protective conducting layer surrounding the high temperature superconductor filament and interposed between the high temperature superconductor filament and the reinforcing material. The protective conducting layer can be Ag or a Ag alloy. The reinforcing material can be attached to the superconductor in any suitable manner, such as formed as a sheath in a coaxial arrangement relative to the superconductor, or as a filament that is wound about or otherwise joined to the superconductor and if present a protective conducting sheath such as Ag, or as a strand that is adhered to the superconductor during the initial fabrication of the superconductor and prior to winding of the coil. The advantage to such a construction is that the composite superconductor with an integral reinforcement attached to the superconductor can be wound in a single step, as opposed to co-winding the superconductor with reinforcement wire, band tape and/or fabric.

A magnet includes a coil comprising a superconductor comprising a high temperature superconductor (HTS) filament. The superconductor is wound to form a coil. A reinforcement winding is positioned within the superconductor coil so as to be embedded within the coil. The high temperature superconductor can be ($Bi_2Sr_2CaCu_2O_{8+\delta}$) Bi-2212. The superconductor coil can be wound on a mandrel.

The invention incorporates one or multiple layers of high strength, heat resistant reinforcement materials, fabric or metal, wound as wire, tape, banding, yarn or roving where required. Both of the additions add mechanical strength to the winding pack. While the reinforcement co-winding can be added as a co-winding to all interstitial spaces within the superconductor coil without altering the geometry of the winding pack, reinforcement fabric layers if provided can be placed between layers of superconducting wire as determined by computer models of the particular stress situation. These reinforcements take up part of the mechanical load and redistribute coil pack stresses, limiting the peak strains expected to occur at those locations so that the coil cannot experience damage even under its high operational stresses. Introducing a layer of a high strength reinforcement material into the winding pack allows for a very compact and efficient magnet coil as it minimizes reduction of its winding current density $J_w$ (i.e. the total winding current divided by the total cross section of the winding pack) caused by the change in coil geometry due to the added reinforcement.

Figure 1B:
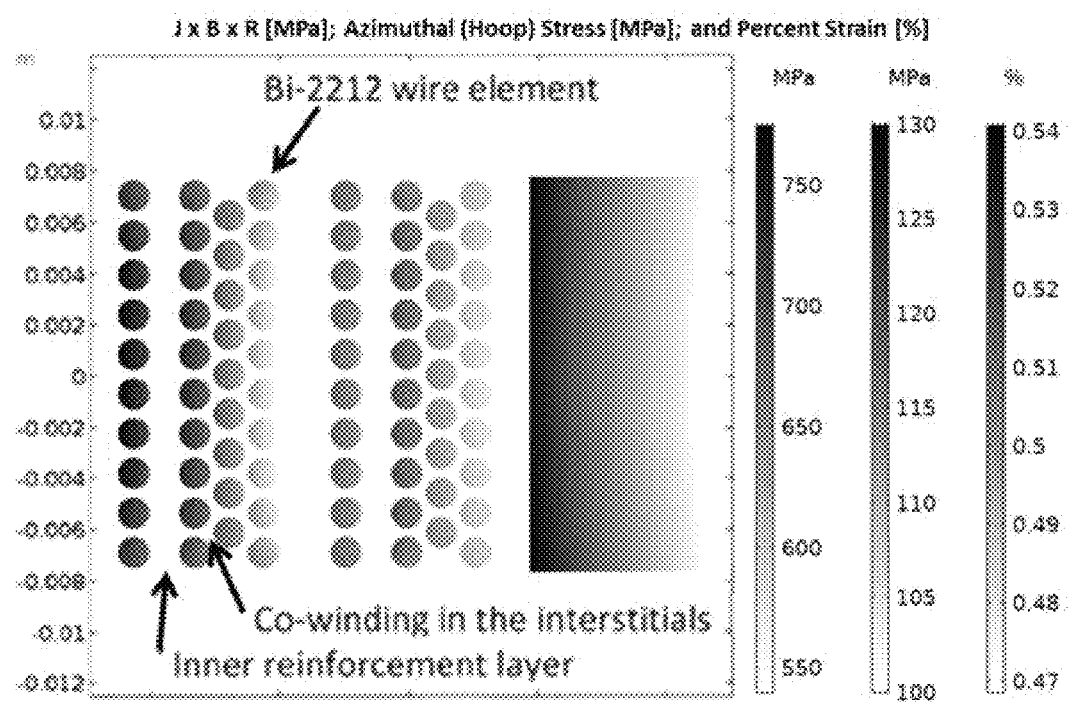
FIG. 1B is a stress and strain map of a 4 layer coil in an 8 T background magnetic field, with coil reinforcement according to the invention.

FIG. 1A-B shows the results of a computer model calculation of a coil (FIG. 1A) with and (FIG. 1B) without co-winding and the internal reinforcement layer. These figures show that with the reinforcement of the invention the operating current of the coil and hence the generated field can be significantly higher with the reinforcement in place.

Figure 2:
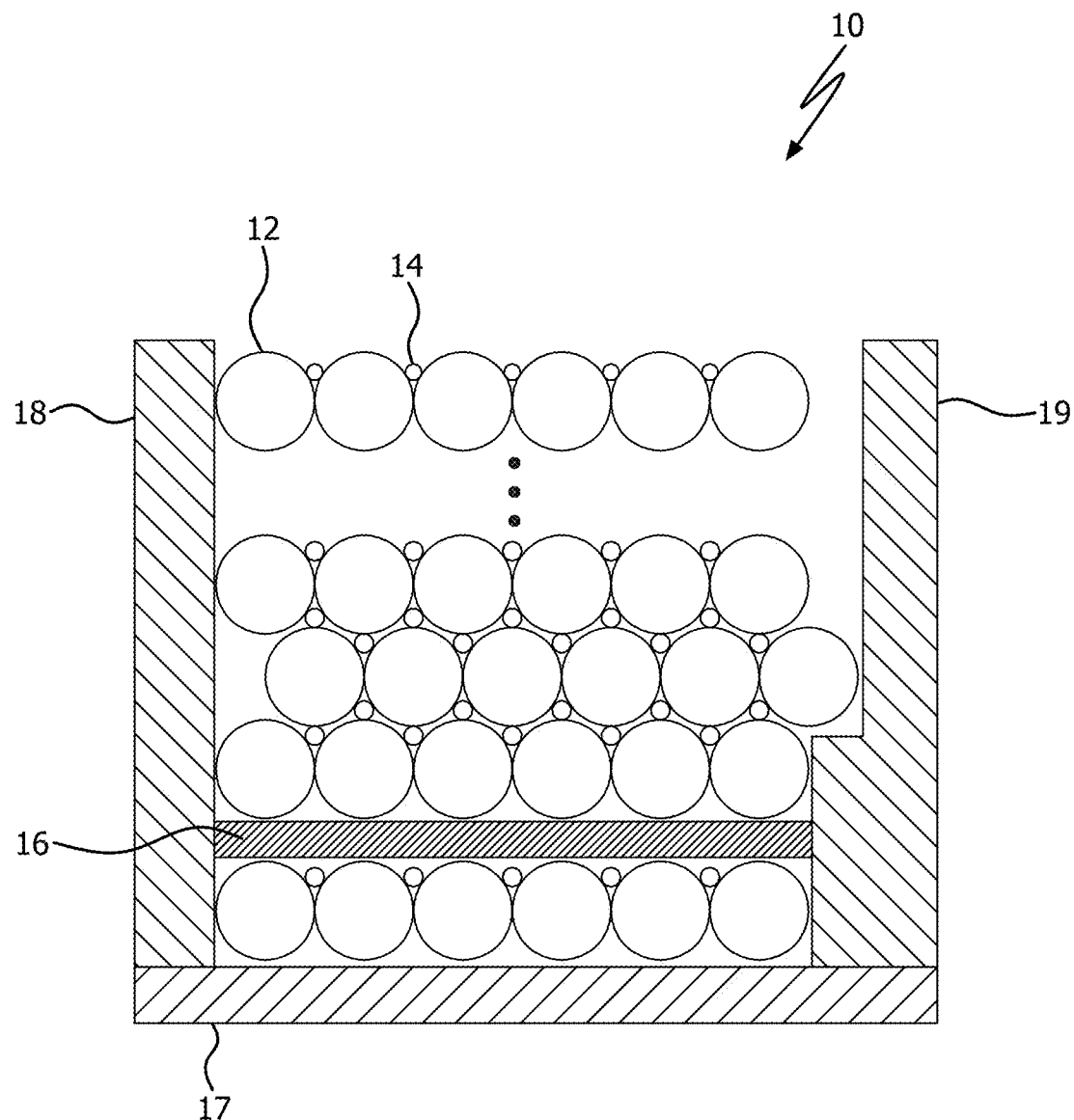
FIG. 2 is a cross sectional schematic drawing of a coil winding pack with inner banding.
Figure 3B:
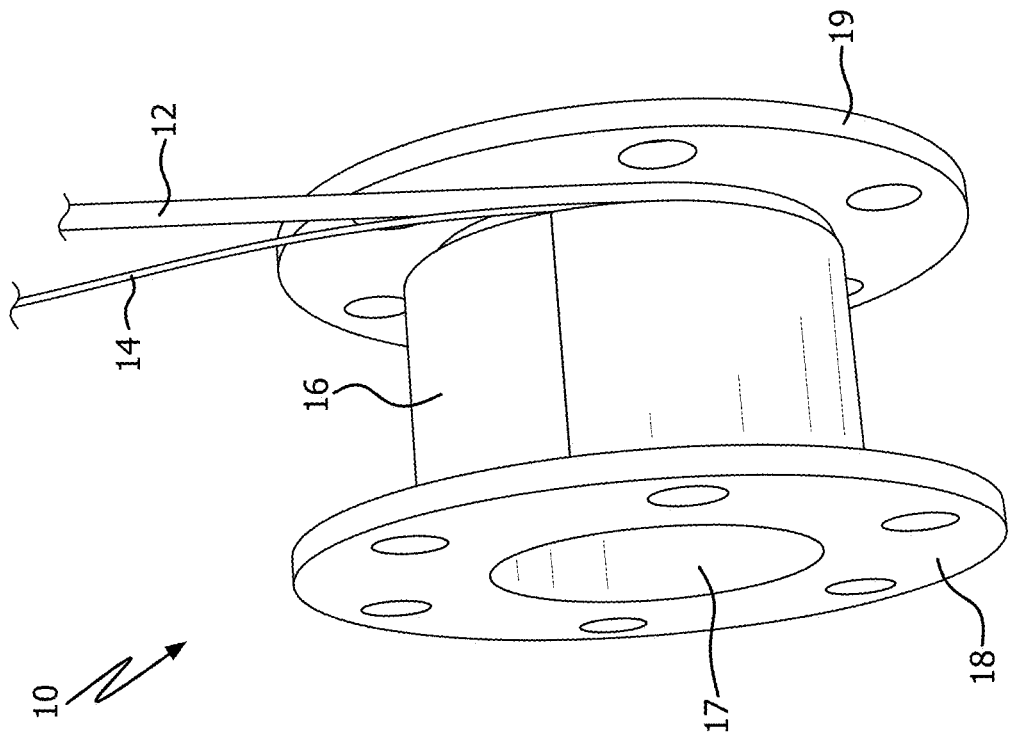
FIG. 3B is a schematic drawing of a coil reinforcement fabric winding applied.
Figure 3A:
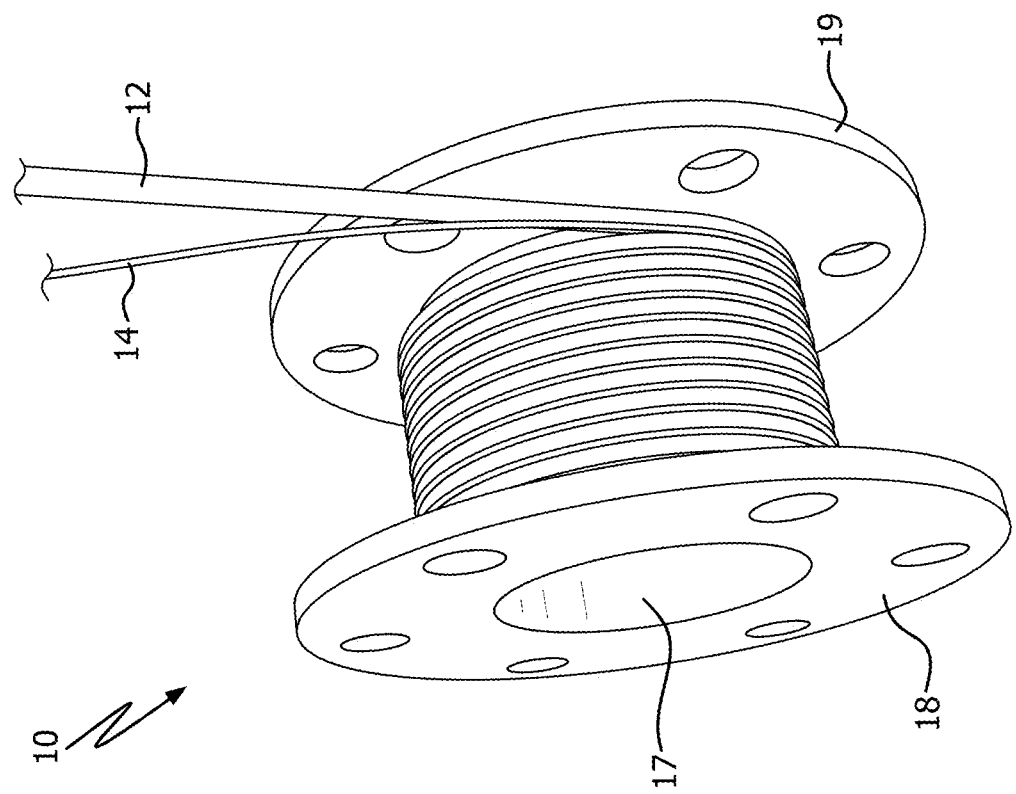
FIG. 3A is a schematic drawing of a coil being wound with a co-winding reinforcement according to the invention.

One embodiment of such reinforcement is shown in FIG. 2, a cross sectional drawing of a coil winding pack 10. The coil winding pack can include a superconductor 12 that is wound on a mandrel 17 with sides 18, 19. The coil winding pack 10 can further include a reinforcement winding. The reinforcement winding can include a co-winding reinforcement wire 14 wound in the interstices of the superconductor 12. The reinforcement winding can also include a reinforcement band 16 that is wound in between layers of the coil winding 10. FIG. 3A is a schematic depiction of a coil with a reinforcement wire 14 being co-wound with the superconductor 12. FIG. 3B shows the fabric reinforcement band 16 being applied over a layer of the coil 10 that comprises the superconductor 12 and the reinforcement co-winding 14. The location and amount of co-winding and fabric reinforcement band layer 16 shown in the images is for illustration purpose only and can change with the design of a particular magnet. The reinforcement fabric layer 16 can be a woven material or a solid sheet of reinforcement material. An epoxy (not shown) can be applied to embed the superconductor and the reinforcement winding. The invention can be used in other epoxy impregnated magnets and is not limited to use with only Bi-2212 conductor wound magnets.

Pure alumina fiber in various forms as yarns, roving, bamds, ceramic film or woven fabric are a good choice for reinforcement material as they are very strong, have a high Young's Modulus, are chemically compatible with the Bi-2212 conductor and together form a nearly monolithic structure inside an epoxy impregnated coil. A typical way to make magnets generating fields beyond 25 T is to nest a high temperature superconductor coil inside a low temperature superconductor outsert magnet. The size of the high temperature superconductor coil hence determines the required bore size of the low temperature superconductor outsert magnet. Inner-banding, which is adding structural layers at various places inside the coil, has the advantage that it is applied only where it is needed, which prevents unnecessary over-reinforcement of other parts of the coil that would increase the coil volume and lead to a reduction in $J_w$. It thus allows for a very compact and efficient magnet design.

Redistributing stresses in high field coils is a major task in all magnets generating high magnetic fields. The coil reinforcement of the invention is applicable to any epoxy impregnated electro-magnet, including magnets for use high field research magnet systems or nuclear magnetic resonance (NMR) magnet systems.

A test coil protocol was developed to investigate stresses and strains of a coil operating near the Bi-2212 ($Bi_2Sr_2Ca_1Cu_2O_{8+\delta}$) conductor's mechanical limits. Highly detailed finite element modeling (FEM) provides computed predictions of how stresses are distributed across each test coil energized while nested within an outsert magnet generating a background field. Good agreement between the numerically derived solutions from FEM work with experimental data collected from real test coils enables guided test plans for further exploring the efficacy of reinforcement schemes. Coil-level mechanical reinforcement techniques accordingly to the invention were tried for Bi-2212 RW solenoids. Three such coils were prepared: one with only superconductor wound into the coil, one with a complement of reinforcement wire co-winding and fabric reinforcement, and one with only the reinforcement co-winding.

Bi-2212 is a wind-and-react superconductor. In addition to the cryogenic temperatures required for the material to enter a superconducting state, in the case of Bi-2212 –269° C., the material must first be heat treated, at ~890° C. in an oxygen rich environment, after being wound into a solenoid to form the proper high current carrying superconducting crystallographic phase. Consequently, all materials used in the manufacturing of the electromagnet must be compatible with that environment and must still function as desired in cryogenic environments. Alumina has been found to satisfy these extraordinary criteria. Woven fabrics and yarns made from 3M™ Nextel™ 610 3M, (Minneapolis MN) ceramic structural fibers were obtained. These nearly pure alumina ($Al_2O_3$) strands have a melting point of 2000° C., excellent mechanical strength with an elastic modulus of 370 GPa and an ultimate tensile strength of 2.8 GPa, and come in a multitude of thread counts for tailoring the product to any specific needs. For the coil-level reinforcement of the test coils, a 0.2 mm diameter yarn, composed of 400 filaments, and a fabric, woven from the same yarn, were used.

Figure 4A:
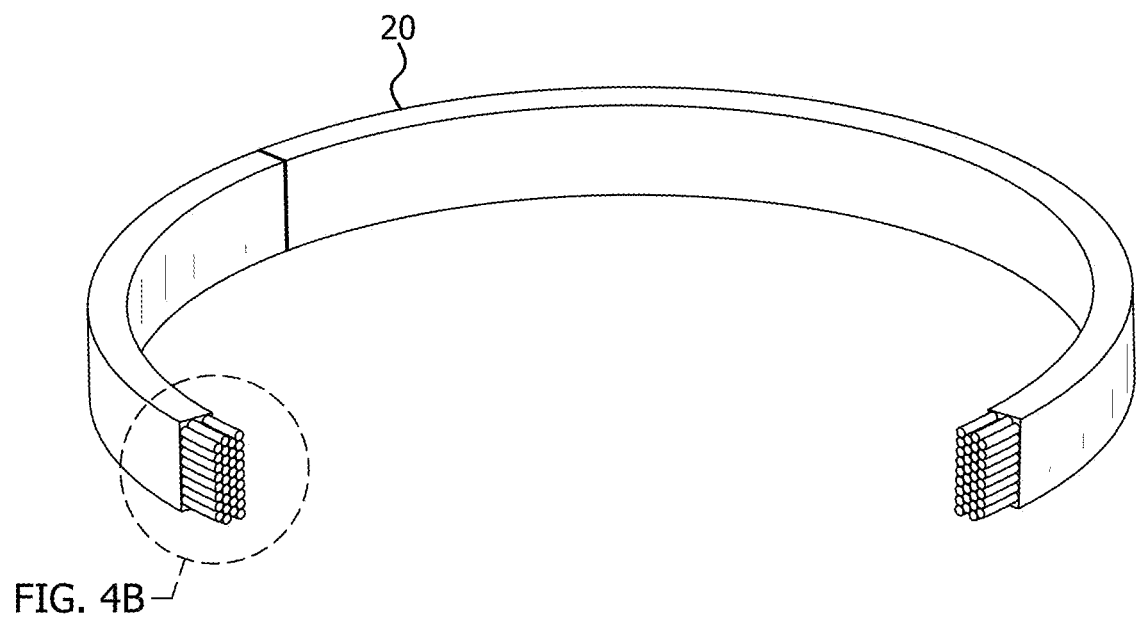
FIG. 4A is a schematic perspective view, partially broken away, of a superconductor magnet coil with a superconductor filament wound and embedded in epoxy.
Figure 4B:
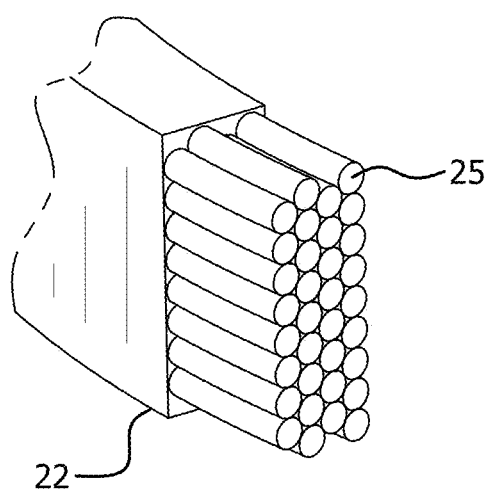
FIG. 4B is a magnified view of area FIG. 4B in FIG. 4A.
Figure 4C:
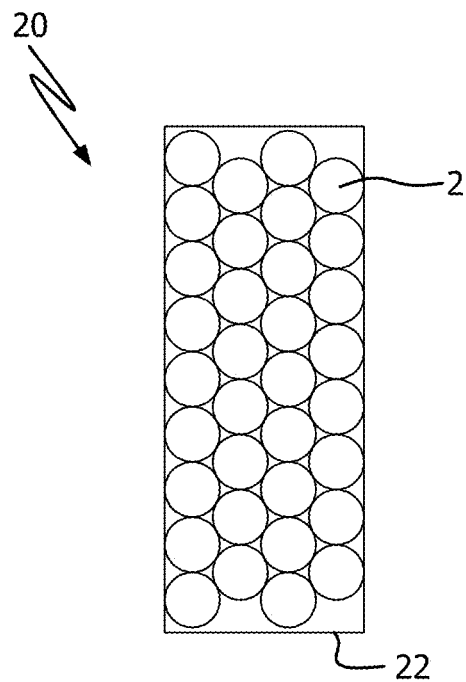
FIG. 4C is a cross section.
Figure 4D:
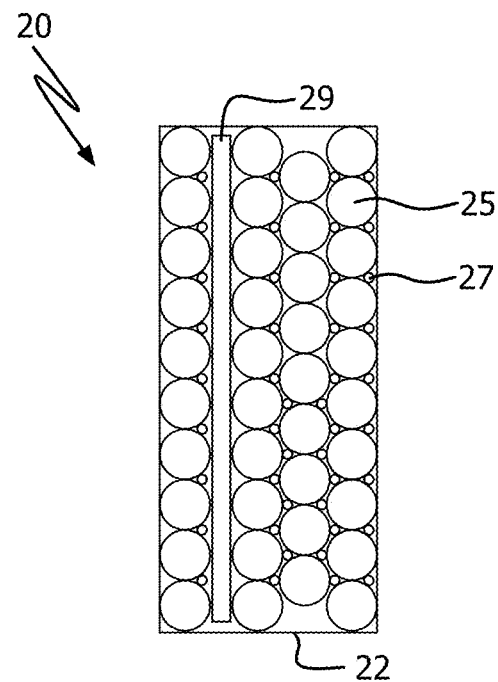
FIG. 4D is a cross section of an embodiment of the invention with a reinforcement co-winding and a reinforcement fabric winding.
Figure 4E:
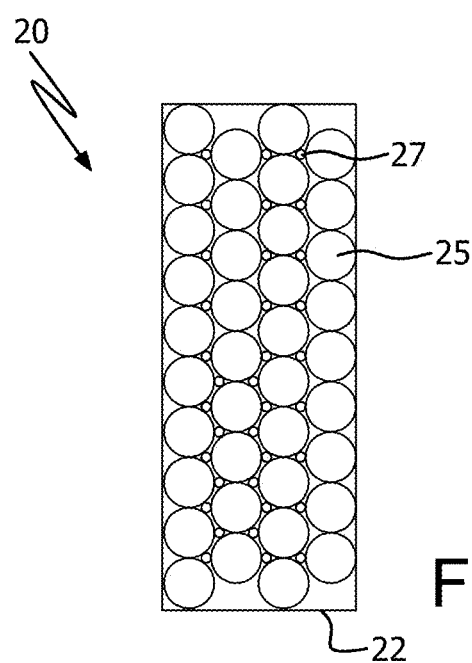
FIG. 4E is a cross section of an embodiment of the invention with a reinforcement co-winding and without a reinforcement fabric.

The Bi-2212 was provided as a bundle of many individual, micron-sized ceramic filaments encased in silver and drawn down to a final wire diameter. The ceramic filaments impose a principal mechanical constraint, as tensile strains, or elongations, exceeding ~0.6% rip apart individual filaments. Three test coils were designed to each be inserted into the available space of an 8 T outsert magnet. All coils were layer-wound on 125 mm mandrels, and all were roughly 10 turns tall and 4 layers wide. Test coil-1 and -2 had 1.3 mm diameter Bi-2212 superconductor, while test coil-3 was wound with 1.0 mm superconductor. All the coils were wound in an orthocyclic, hexagonal pack. FIG. 4A illustrates a typical layer wound coil 20, partially broken away. FIG. 4B is an expanded view of a portion FIG. 4B in FIG. 4A, showing superconductor 25 embedded in epoxy 22. FIG. 4C is a cross sectional view. FIG. 4D is a cross section illustrating the coil 20 having superconductor 25 and reinforcement winding in the form of both a reinforcement wire co-winding 27 and a fabric reinforcement band layer 29, again embedded in epoxy 22. FIG. 4E is another cross section showing an alternative version of the coil 20 with the superconductor 25 and the reinforcement wire co-winding 27 embedded by epoxy 22, without the fabric reinforcement innerband layer.

The coils are very similar in terms of number of turns, ID, and OD. The testing of these three coils provides a direct measure of the efficacy of the different reinforcement schemes. In general, the coil without reinforcement (FIG. 4C) was a control to ensure the superconducting coil tested would closely reflect a real coil. This test coil was built as a coil with expected performance independent of any mechanical limitations in an 8 T background. The test coil was tailored to mechanically fail at a quantifiably predictable point, in order to further validate the numerical prediction.

Figure 5:
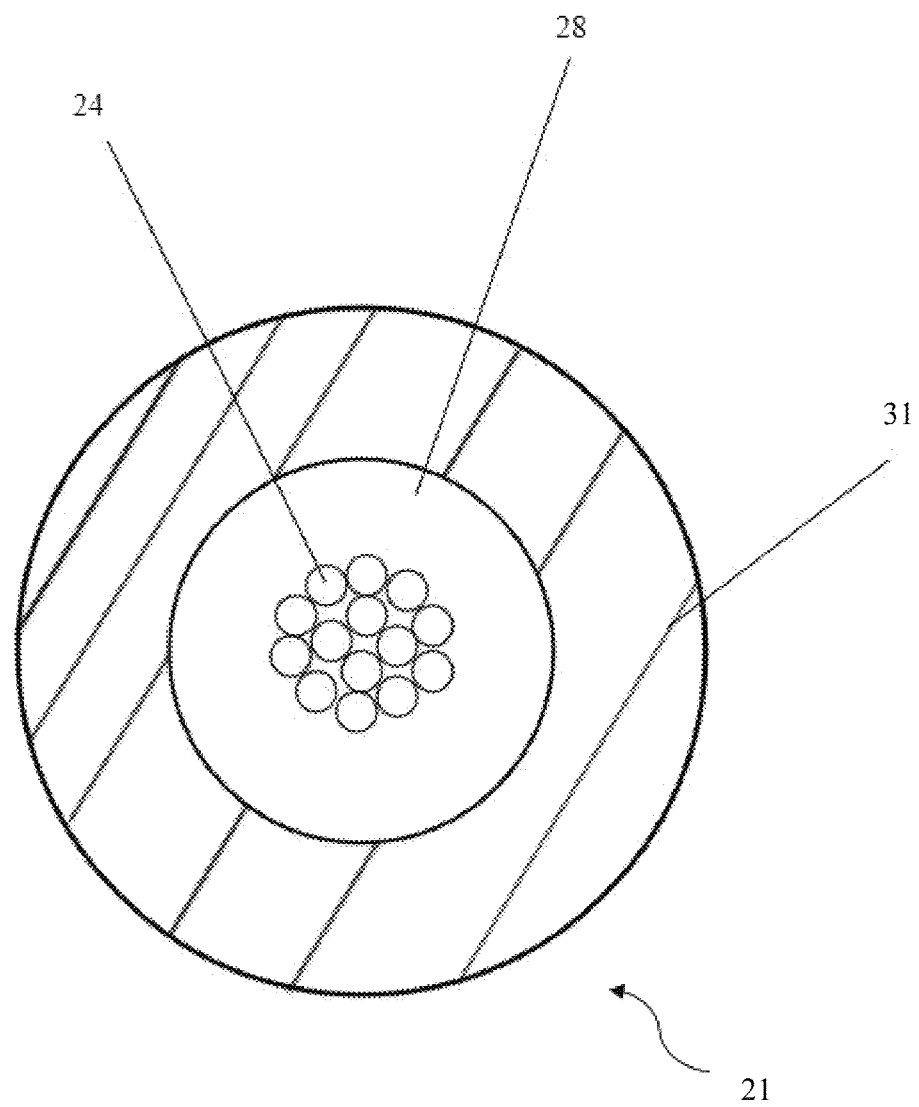
FIG. 5 is a schematic cross-sectional diagram of a composite conductor according to the invention.

FIG. 5 is a cross-sectional schematic diagram of a composite superconductor 21 comprising a high temperature superconductor filament or filament bundle 24 such as Bi-2212. The high temperature superconductor filament 24 can be encased by a protective conducting layer 28 of electric stabilizing material, such as Ag or a Ag alloy. A reinforcing material outer layer 30 such as $Al_2O_3$ or SiC can encase the filament 24 and the protective conducting layer 28. The composite conductor 20 provides a reinforced, HTS conductor construction that can be wound directly into a coil and because the reinforcing material 31 is integral with the filament 24, a co-winding technique is not necessary. Although the composite superconductor 21 is shown in a coaxial construction, other geometries including outside-wrapped or a layered construction are possible, so long as the reinforcement material is adhered or otherwise connected to the superconductor.

Inconel X750 has satisfactory reinforcement material properties, a melting point of 1400° C., an elastic modulus of 230 GPa, and an ultimate tensile strength 1.11 GPa. A flat 1.5 mm×0.15 mm tape was used with the Bi-2212 superconductor which was slightly aspected such that a flat Inconel X750 co-winding tape could be used. The Inconel X750 should undergo a pre-oxidation treatment prior to winding in the coil. The heat treatment of Bi-2212 takes place typically in 1 atm of $O_2$ in Ar. The oxygen content must be carefully controlled. The Inconel X750 if not pre-treated will undergo oxidation and remove some of the available $O_2$ for the superconductor reaction.

Figure 6A:
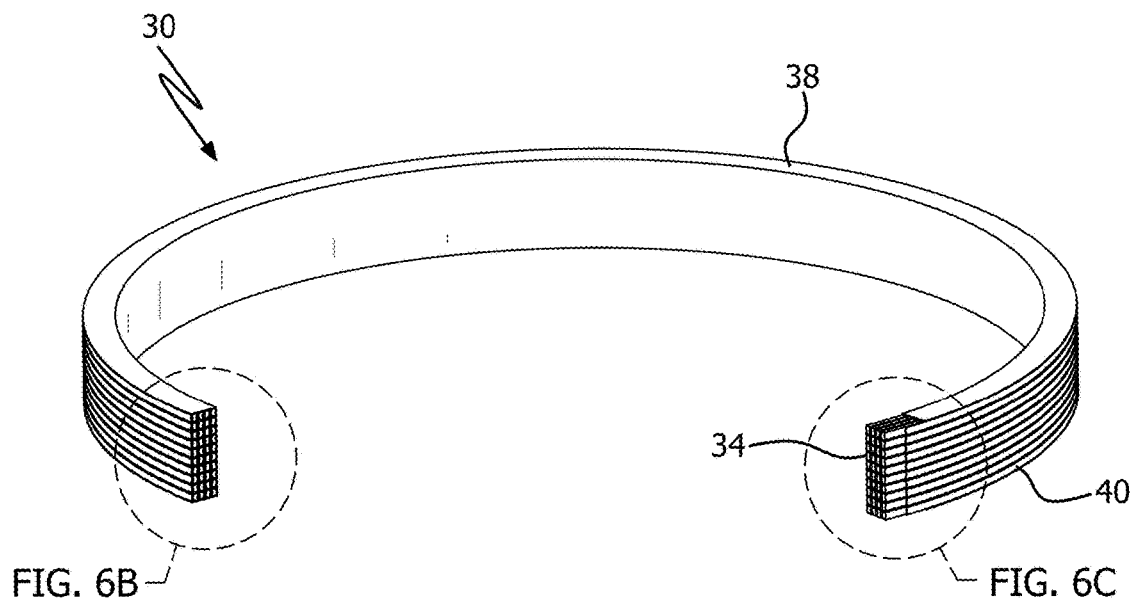
FIG. 6A is a perspective view, partially broken away, of a superconductor coil with an aspected superconductor filament and a reinforcement tape co-winding.
Figures 6B, 6C:
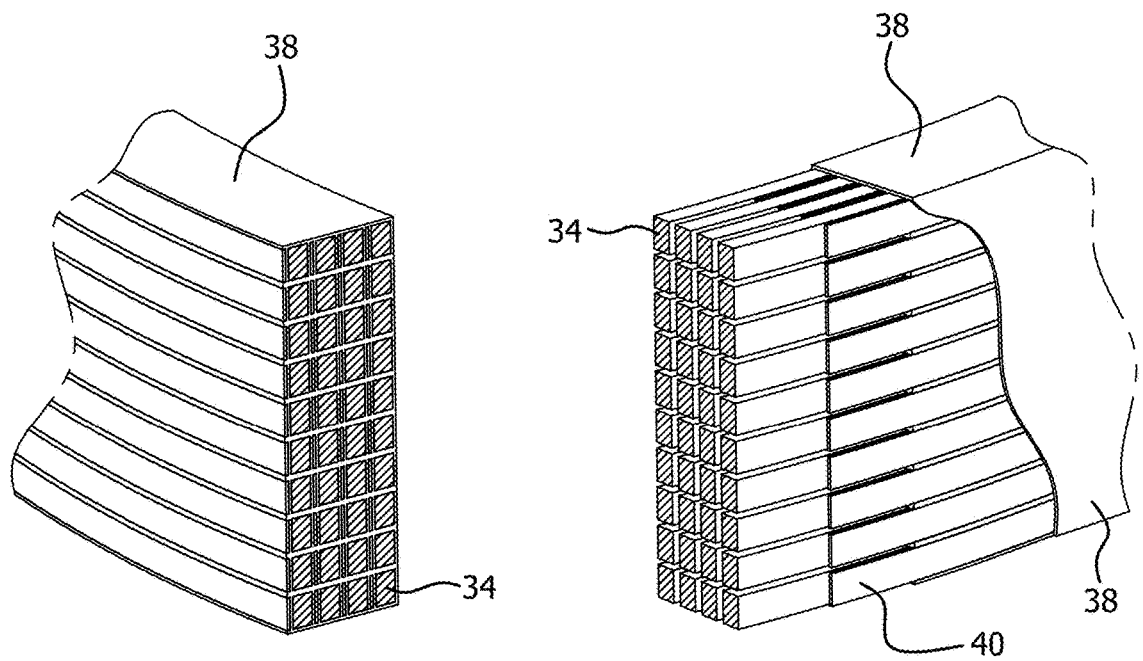
FIG. 6B is an enlargement of area FIG. 6B in FIG. 6A.
FIG. 6C is an enlargement of area FIG. 6C in FIG. 6A.
Figure 6D:
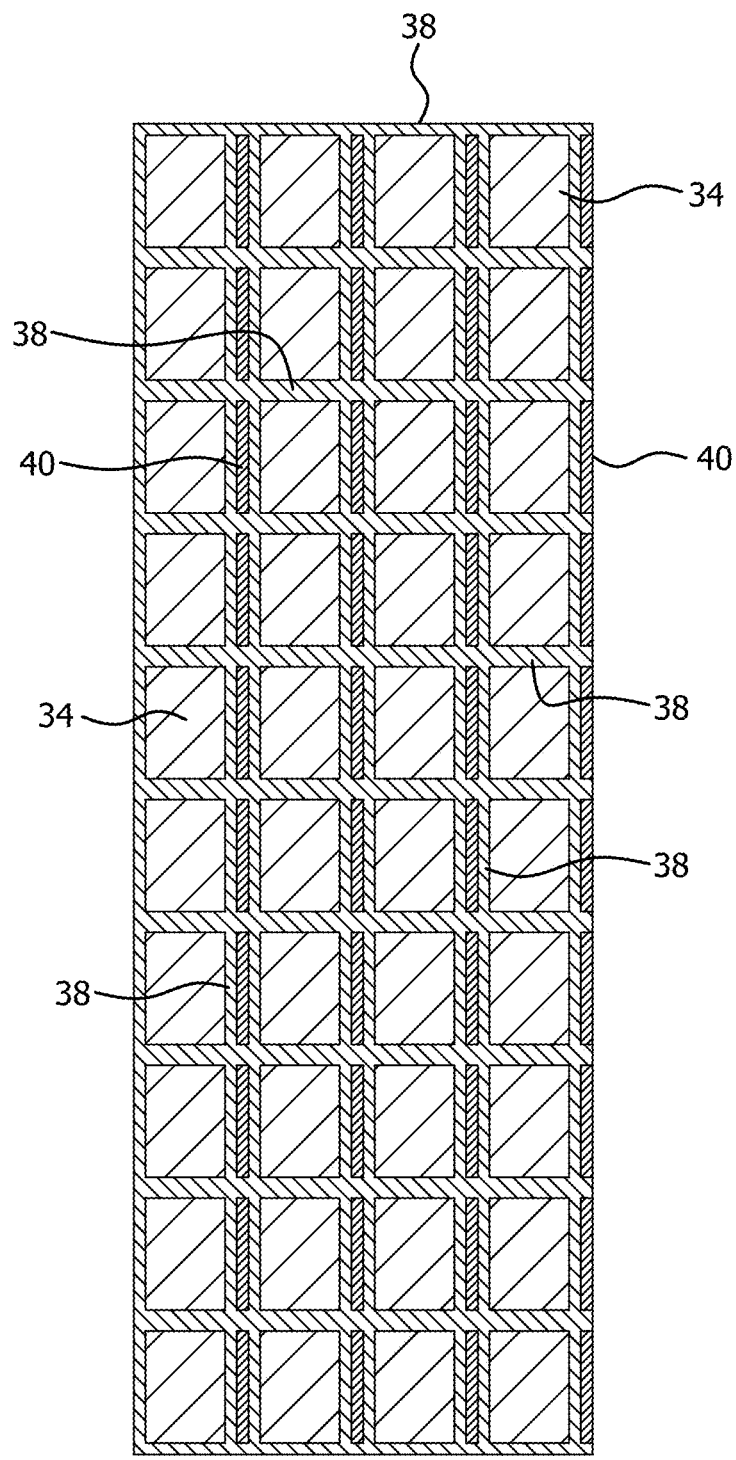
FIG. 6D is a cross section of the coil.

Inconel X750 was flattened to a thin superconductor tape 0.15 mm thick and 1.5 mm wide was created, and essentially after every layer of superconductor filament was wound, an additional layer of Inconel X750 was wound on top of the superconductor filament with the broad side against the previous layer of superconductor. The Inconel X750 was pre-oxidized to ensure its chemical compatibility with the conductor heat treatment. FIGS. 6A-FIG. 6C shows such an embodiment, in which the coil 30 is comprised of the wound aspected superconductor 34, with reinforcement tape 40 in place adjacent the aspected superconductor 34 wraps. The superconductor 34 and reinforcement winding tape 40 are shown embedded in epoxy 38. A reinforcement fabric or sheet (not shown) could also be provided.

The invention as shown in the drawings and described in detail herein disclose arrangements of elements of particular construction and configuration for illustrating preferred embodiments of structure and method of operation of the present invention. It is to be understood however, that elements of different construction and configuration and other arrangements thereof, other than those illustrated and described may be employed in accordance with the spirit of the invention, and such changes, alternations and modifications as would occur to those skilled in the art are considered to be within the scope of this invention as broadly defined in the appended claims. In addition, it is to be understood that the phraseology and terminology employed herein are for the purpose of description and should not be regarded as limiting.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A coil for a magnet, comprising:
    a superconductor comprising $Bi_2Sr_2Ca_1Cu_2O_{8+\delta}$ (Bi-2212) high temperature superconductor (HTS) filaments;
    the superconductor being wound to form a coil having a plurality of superconductor winding layers; and,
    at least one reinforcement band winding being wound selectively between superconductor winding layers;
    wherein the reinforcement band is made of a material that has a modulus of elasticity ≥100 GPa, a tensile strength above 0.5 GPa, is chemically inert with respect to the Bi-2212, and retains these properties after a heat treatment to 890° C., wherein the reinforcement band material comprises at least one selected from the group consisting of $Al_2O_3$ and Inconel X750.

2. The coil of claim 1, wherein the superconductor filament is encased in a protective conducting sheath.

3. The coil of claim 2, wherein the protective conducting layer comprises Ag.

4. The coil of claim 1, wherein the reinforcement winding is at least one selected from the group consisting of a wire, a tape, and a fabric.

5. The coil of claim 1, wherein the superconductor is circular, square, or rectangular in cross section.

6. The coil of claim 1, wherein the superconductor is wound as orthocyclic.

7. The coil of claim 1, wherein the superconductor is wound as hexagonal pack.

8. The coil of claim 1, wherein the superconductor in the coil has a tensile strain no greater than 0.6%.

9. The coil of claim 1, further comprising a coil mandrel, the superconductor, and the reinforcement winding being wound on the mandrel.

10. The coil of claim 1, wherein the superconductor and reinforcement winding are embedded in epoxy.

11. The coil of claim 1, further comprising a reinforcement wire co-winding made of the reinforcement material that is co-wound with the superconductor during the coil winding process.

12. A superconducting magnet comprising coils, the coils comprising a superconductor comprising a high temperature superconducting (HTS) filaments, the superconductor being wound in winding layers to form a coil, and a reinforcement band, the reinforcement band being wound selectively between superconductor winding layers, wherein the high temperature superconductor filament comprises $Bi_2Sr_2Ca_1Cu_2O_{8+\delta}$ (Bi-2212), wherein the reinforcement band is made of a reinforcement material that has a modulus of elasticity ≥100 GPa, a tensile strength above 0.5 GPa, is chemically inert with respect to the Bi-2212, and retains these properties after a heat treatment to 890° C., wherein the reinforcement band material comprises at least one selected from the group consisting of $Al_2O_3$ and Inconel X750.

13. The magnet of claim 12, further comprising at least one additional reinforcement winding, the additional reinforcement winding comprising at least one selected from the group consisting of a wire, a tape, and a band.

14. The magnet of claim 12, wherein the coil has a tensile strain of no more than 0.6%.

15. The magnet of claim 12, wherein the superconductor and the reinforcement winding are embedded in an epoxy.

* * * * *